United States Patent
Kosaki et al.

(10) Patent No.: US 9,269,778 B2
(45) Date of Patent: Feb. 23, 2016

(54) SEMICONDUCTOR APPARATUS INCLUDING N-TYPE SEMICONDUCTOR LAYER

(71) Applicant: TOYODA GOSEI CO., LTD., Kiyosu-shi (JP)

(72) Inventors: Masayoshi Kosaki, Kiyosu (JP); Takahiro Fujii, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/175,893

(22) Filed: Feb. 7, 2014

(65) Prior Publication Data
US 2014/0264366 A1    Sep. 18, 2014

(30) Foreign Application Priority Data
Mar. 12, 2013    (JP) .................................. 2013-048719

(51) Int. Cl.
*H01L 29/20* (2006.01)
*H01L 21/02* (2006.01)
*H01L 29/872* (2006.01)
*H01L 29/66* (2006.01)

(52) U.S. Cl.
CPC ........ *H01L 29/2003* (2013.01); *H01L 21/0254* (2013.01); *H01L 21/0262* (2013.01); *H01L 21/02389* (2013.01); *H01L 21/02458* (2013.01); *H01L 21/02576* (2013.01); *H01L 21/02579* (2013.01); *H01L 29/66522* (2013.01); *H01L 29/872* (2013.01)

(58) Field of Classification Search
CPC ... H01L 21/02104; H01L 21/06; H01L 21/16; H01L 21/20; H01L 21/36; C30B 29/40; C30B 29/403; C30B 29/406
USPC ............................................. 257/76; 438/478
See application file for complete search history.

(56) References Cited

U.S. PATENT DOCUMENTS

2007/0032046 A1* 2/2007 Dmitriev et al. ............... 438/478
2012/0032215 A1* 2/2012 Saito et al. ....................... 257/98

FOREIGN PATENT DOCUMENTS

JP        2011-035066 A      2/2011
JP         2011035066 A   *  2/2011   ............ H01L 21/338

\* cited by examiner

*Primary Examiner* — Evan Pert
*Assistant Examiner* — Changhyun Yi
(74) *Attorney, Agent, or Firm* — McGinn IP Law Group, PLLC

(57) ABSTRACT

A semiconductor apparatus includes a semiconductor substrate that has a diameter of 2 inches or larger, and an N-type semiconductor layer that is stacked on the semiconductor substrate using a material including gallium nitride (GaN). A median of a plurality of measured values of the concentration of carbon (C) at a plurality of locations on a face of a region of the N-type semiconductor layer is equal to or lower than $1.0 \times 10^{16}$ cm$^{-3}$. The maximum value in difference between the median and the other measured values is lower than $5 \times 10^{15}$ cm$^{-3}$.

16 Claims, 6 Drawing Sheets

SEMICONDUCTOR APPARATUS INCLUDING N-TYPE SEMICONDUCTOR LAYER

CROSS-REFERENCE TO RELATED APPLICATION

This application claims the benefit of Japanese Patent Application No. 2013-048719 (filed on Mar. 12, 2013), the entire contents of which are hereby incorporated by reference.

BACKGROUND

1. Technical Field

The present invention relates to a semiconductor apparatus and a method of manufacturing the same.

2. Related Art

As semiconductor apparatuses (semiconductor devices and semiconductor elements) used for controlling electric power, a gallium nitride (GaN) based semiconductor apparatus is known, in which an N-type semiconductor layer is stacked on a semiconductor substrate. The N-type semiconductor layer contains gallium nitride (GaN) as a main material, and silicon (Si) as a donor (dopant or impurities). As such N-type semiconductor layers, one is known in which an $n^-$-GaN layer has a low donor concentration of about $1\times10^{16}$ $cm^{-3}$ for the primary purpose of increasing withstanding voltage (e.g., see Patent Document 1).

In general, such N-type semiconductor layer is manufactured by a metal organic chemical vapor deposition (MOCVD) method. In MOCVD, trimethylgallium (TMGa: $(CH_3)_3Ga$) is used as a source of gallium (Ga). As a source of nitrogen, ammonia ($NH_3$) is used. Hydrogen is used as a carrier gas. Silane is used as an N-type dopant source.

[Patent Document 1] JP-A-2011-35066 A

When the N-type semiconductor layer has a low donor concentration of about $1\times10^{16}$ $cm^{-3}$, the N-type semiconductor layer can be easily affected by other impurities to cause a non-uniform distribution of the concentration of donor, so that it is difficult to achieve uniform electric properties on the substrate. Such variation in the concentration of donor affects withstanding voltage in interfaces with other semiconductor layers and electrodes. In particular, when the N-type semiconductor layer is formed on a semiconductor substrate having a large diameter of more than 2 inches by vapor deposition, the N-type semiconductor layer is easily affected by impurities, such as carbon. Therefore, there is a problem in that, when a plurality of chips are cut out from the semiconductor wafer, variation in product quality is prone to be caused in each chip.

The present invention is directed to solve the above problems, and accordingly, can be embodied in the following forms.

(1) According to an aspect of the invention, a semiconductor apparatus includes a semiconductor substrate that has a diameter of 2 inches or larger and an N-type semiconductor layer that is stacked on the semiconductor substrate using a material including gallium nitride (GaN). A median of a plurality of measured values of the concentration of carbon (C) at a plurality of locations on a face of a region of the N-type semiconductor layer is equal to or lower than $1.0\times10^{16}$ $cm^{-3}$, and the maximum value in difference between the median and the other measured values is lower than $5\times10^{15}$ $cm^{-3}$.

Carbon (C) of the N-type semiconductor layer has an action of compensating and reducing a donor of the N-type semiconductor layer. According to the semiconductor apparatus of the above form, because the median of a plurality of measured values of the concentration of carbon (C) is equal to or lower than $1.0\times10^{16}$ $cm^{-3}$ and the maximum value in difference between the median and the other measured values is lower than $5\times10^{15}$ $cm^{-3}$, the concentration of carbon (C) allows a concentration of donor in the region of the N-type semiconductor layer to be uniform, without non-uniformly compensating the donor by carbon (C). Therefore, when a plurality of chips are cut out from a substrate of more than 2 inches to form semiconductor apparatuses, the function of the donor in each of the obtained semiconductor apparatuses can be stable and uniform.

(2) In the configuration of (2), the N-type semiconductor layer contains silicon as a donor, a median of a plurality of measured values of the concentration of the donor at a plurality of locations on the face of the region of the N-type semiconductor layer is equal to or lower than $1.4\times10^{16}$ $cm^{-3}$, and the maximum value in difference between the median and the other measured values is lower than $5\times10^{15}$ $cm^{-3}$.

If the concentration of donor is lower as in the above form, the donor can be easily affected by variation in the concentration of carbon (C). In the present form, because the concentration of carbon (C) is reduced, variation in action of the donor can be reduced.

(3) In the semiconductor apparatus of (1) or (2), electrodes are respectively connected to the substrate and the N-type semiconductor layer.

(4) In the semiconductor apparatus of (1) or (2) further includes a P-type semiconductor layer that is stacked on the N-type semiconductor layer, and an additional N-type semiconductor layer that is stacked on the P-type semiconductor layer. A drain electrode is connected to the substrate, a source electrode is connected the additional N-type semiconductor layer, and a gate electrode is connected to an insulation layer on the P-type semiconductor layer.

As aspects of the semiconductor apparatus, various configurations can be employed.

(5) According to another aspect of the invention, a method of manufacturing the semiconductor apparatus according to any one of (1) to (4) includes forming the N-type semiconductor layer by crystal growth using a group III raw material including trimethylgallium (TMGa) and a group V raw material including ammonia ($NH_3$). V/III, a mole ratio of the group V raw material to the group III raw material, is a range of 2100 to 4000.

With the configuration of (5), the N-type semiconductor layer is formed by crystal growth using the group III raw material including trimethylgallium (TMGa) and the group V raw material including ammonia ($NH_3$). By using such V/III, the concentration of carbon (C) can be set in the range as described above. Meanwhile, in the following description, the V/III means a mole ratio of the group V raw material to the group III raw material.

According to another aspect of the invention, a method of manufacturing a semiconductor apparatus having an N-type semiconductor layer stacked on a semiconductor substrate using a material including gallium nitride (GaN) includes a first step of arranging a plurality of the substrates in a region of more than 2 inches in diameter, and a second step of forming the N-type semiconductor layer by crystal growth, using a group III raw material including trimethylgallium (TMGa) and a group V raw material including ammonia ($NH_3$). The second step is adjusted so that a V/III, a mole ratio of the group V raw material to the group III raw material, is within a range of 2100 to 4000, and also so that a median of a plurality of measured values of the concentration of carbon (C) at a plurality of locations on a face of a region of the N-type semiconductor layer is equal to or lower than $1.0 \times 10^{16}$ cm$^{-3}$ and the maximum value in difference between the median and the other measured values is lower than $5 \times 10^{15}$ cm$^{-3}$.

(7) In the configuration of (6), the second step is adjusted so that silicon (Si) is contained as a donor, and also so that a median of a plurality of measured values of the concentration of the donor at a plurality of locations on the face of the region of the N-type semiconductor layer is equal to or lower than $1.4 \times 10^{16}$ cm$^{-3}$, and the maximum value in difference between the median and the other measured values is lower than $5 \times 10^{15}$ cm$^{-3}$.

With the configuration of (7), a plurality of the substrates are arranged in the region of more than 2 inches and in this state, the N-type semiconductor layer is formed thereon by crystal growth. In this form, the N-type semiconductor layer can be concurrently formed on a plurality of the substrates in the region of more than 2 inches.

In a configuration in which an N-type semiconductor layer added with a donor of a low concentration is stacked, the present invention allows the concentration of the donor to be uniform over a broad range on the face of the N-type semiconductor layer, even on large semiconductor substrates of more than 2 inches.

A. Embodiments (1) Schematic Configuration of a Semiconductor Apparatus 10

Figure 1:
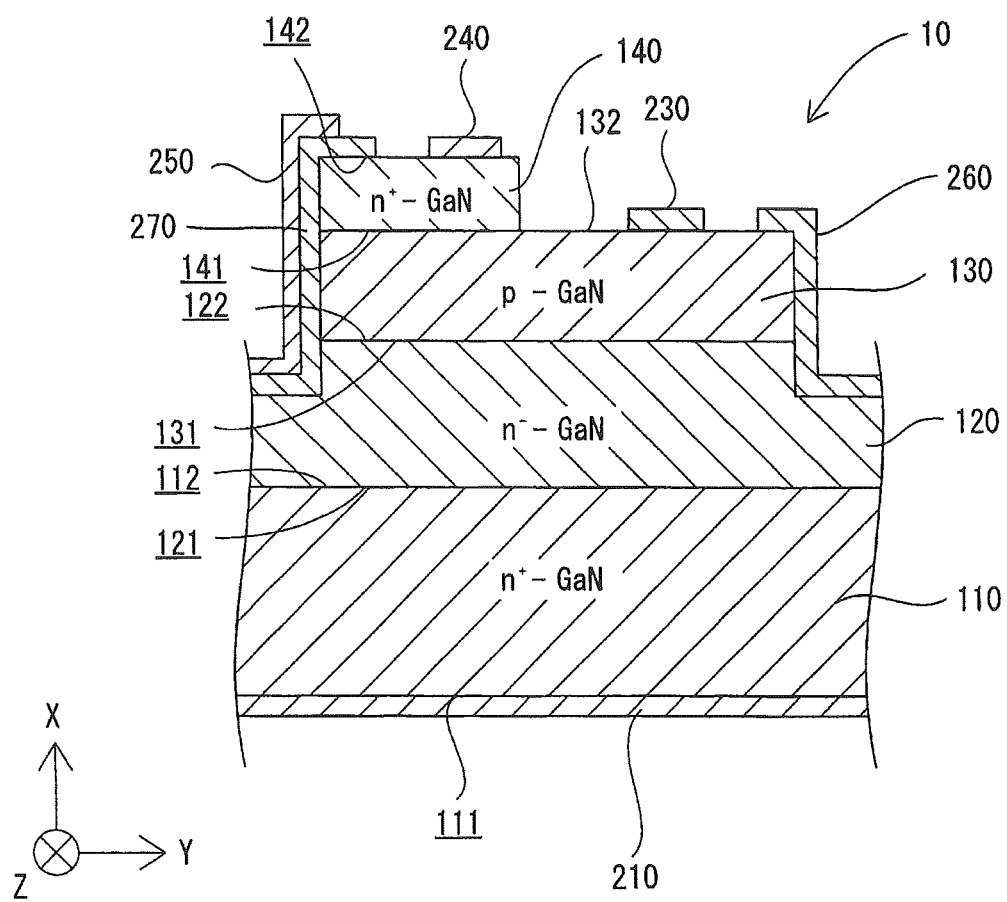
FIG. 1 is a sectional view schematically showing a configuration of a semiconductor apparatus.

FIG. 1 is a sectional view schematically showing a configuration of the semiconductor apparatus 10. The semiconductor apparatus 10 is a GaN-based semiconductor apparatus formed using gallium nitride. The semiconductor apparatus mentioned herein is equivalent to one which includes a semiconductor wafer according to embodiments and the peripheral components. In addition, FIG. 1 is a view illustrated to easily understand technical features of the semiconductor apparatus 10, not intended to exactly depict dimensions of each part thereof. In the present embodiment, the semiconductor apparatus 10 is used for controlling electric power and thus, is referred to as a power device, also so-called a vertical MOSFET (Metal-Oxide-Semiconductor Field-Effect Transistor).

The semiconductor apparatus 10 is a NPN-type semiconductor apparatus including a substrate 110, a first N-type semiconductor layer 120, a P-type semiconductor layer 130 and a second N-type semiconductor layer 140, and has a structure in which the first N-type semiconductor layer 120, the P-type semiconductor layer 130 and the second N-type semiconductor 140 are stacked in this order on a substrate 110 by crystal growth using a metal organic chemical vapor deposition (MOCVD) method.

In FIG. 1, XYZ axes perpendicular to each other are shown. The X-axis of XYZ axes in FIG. 1 is an axis along a stacking direction, in which the first N-type semiconductor layer 120 is stacked on the substrate 110. A +X-axis direction of the X-axis direction along the X-axis is a direction directing from the substrate 110 to the first N-type semiconductor layer 120, and a −X-axis direction is a direction opposite to the +X-axis direction. The Y-axis and Z-axis of XYZ axes in FIG. 1 are axes perpendicular to the X-axis and also to each other. A +Y-axis direction of the Y-axis direction along the Y-axis is a direction directing from left to right in the paper plane of FIG. 1, and a −Y-axis direction is a direction opposite to the +Y-axis direction. A −Z-axis direction of the Z-axis direction along the Z-axis is a direction directing from the back side to the front side with respect to the paper plane of FIG. 1, and a +Z-axis direction is a direction opposite to the +Z-axis direction.

(2) Configuration of Each Part of the Semiconductor Apparatus 10

(2)-1 Substrate 110

The substrate 110 has a plate shape extending along a plane parallel to the Y-axis and Z-axis. In the present embodiment, the substrate 110 consists essentially of gallium nitride (GaN) and also contains silicon (Si) as a donor at a concentration higher than that in the first N-type semiconductor layer 120. In the present embodiment, the average concentration of silicon (Si) over the entire region of the substrate 110 is equal to or higher than $1.0 \times 10^{18}$ cm$^{-3}$. The substrate 110 may be a part configured to fix and support each semiconductor layer of the semiconductor apparatus 10, and in other embodiments, may also be a part consisting essentially of, for example, silicon (Si).

The substrate 10 has an interface 111 and an interface 112. The interface 111 of the substrate 110 is a surface parallel to the Y-axis and the Z-axis and orienting to the −X-axis direction. The interface 112 of the substrate 110 is a surface parallel to the Y-axis and the Z-axis and orienting to the +X-axis direction, and is opposed to the interface 111. The interface 112 is adjacent to the first N-type semiconductor layer 120.

A thickness of the substrate 110 is a distance between the interface 111 and the interface 112 in the X-axis direction, and in the present embodiment, is 320 μm (micrometer). In other embodiments, the thickness of the substrate 110 may be any value selected from a range of 100 μm to 1 mm (millimeter).

In the present embodiment, an electrode 210, also referred as to a drain electrode, is formed on the interface 111 of the substrate 110. In the embodiment, the electrode 210 is an electrode having a structure, in which a layer formed of aluminum (Al) is stacked on a layer formed of titanium (Ti). In other embodiments, the electrode 210 may be an electrode formed of at least one of conductive materials, such as, platinum (Pt), Co (cobalt), palladium (Pd), nickel (Ni), and gold (Au), other than Ti and Al.

(2)-2 First N-Type Semiconductor Layer 120

The first N-type semiconductor layer 120 is formed on the substrate 110 in a stacked state, and thus forms a layer extending on a plane parallel to the Y-axis and the Z-axis. The first N-type semiconductor layer 120 consists essentially of gallium nitride (GaN), and contains silicon (Si) as a donor at a concentration lower than that in the second N-type semiconductor layer 140. A range of the concentration of silicon (Si) will be described below. The first N-type semiconductor layer 120 is also referred as to 'n⁻-GaN'.

The first N-type semiconductor layer 120 has an interface 121 and an interface 122. The interface 121 of the first N-type semiconductor layer 120 is a surface parallel to the Y-axis and the Z-axis and orienting to the −X-axis direction. The interface 121 is adjacent to the substrate 110. The interface 122 of the first N-type semiconductor layer 120 is a surface parallel to the Y-axis and the Z-axis and orienting to the +X-axis direction, and is opposed to the interface 121. The interface 122 is adjacent to the P-type semiconductor layer 130.

A thickness of the first N-type semiconductor layer 120 is a distance between the interface 121 and the interface 122 in the X-axis direction, and in the present embodiment, is 10 μm. In other embodiments, the thickness of the first N-type semiconductor layer 120 may be any value selected from a range of 5 to 15 μm.

(2)-3 P-Type Semiconductor Layer 130

The P-type semiconductor layer 130 is formed on the first N-type semiconductor layer 120 in a stacked state, and thus forms a layer extending on a plane parallel to the Y-axis and the Z-axis. The P-type semiconductor layer 130 consists essentially of gallium nitride (GaN), and contains magnesium (Mg) as an acceptor. In the present embodiment, the average concentration of Mg over the entire region of the P-type semiconductor layer 130 is equal to or higher than $1.0 \times 10^{18}$ $cm^{-3}$ and equal to or lower $1.0 \times 10^{20}$ $cm^{-3}$. The P-type semiconductor layer 130 is also referred as to 'p-GaN'.

The P-type semiconductor layer 130 has an interface 131 and an interface 132. The interface 131 of the P-type semiconductor layer 130 is a surface parallel to the Y-axis and the Z-axis and orienting to the −X-axis direction. The interface 131 is adjacent to the first N-type semiconductor layer 120. The interface 132 of the P-type semiconductor layer 130 is a surface parallel to the Y-axis and the Z-axis and orienting to the +X-axis direction, and is opposed to the interface 131. The interface 132 is adjacent to the second N-type semiconductor layer 140 and an electrode 230.

A thickness of the P-type semiconductor layer 130 is a distance between the interface 131 and the interface 132 in the X-axis direction, and in the present embodiment, is 1 μm. In other embodiments, the thickness of the P-type semiconductor layer 130 may be any value selected from a range of 0.3 to 2 μm.

(2)-4 Second N-Type Semiconductor Layer 140

The second N-type semiconductor layer 140 is formed on the P-type semiconductor layer 130 in a stacked state, and thus forms a layer extending on a plane parallel to the Y-axis and the Z-axis. The second N-type semiconductor layer 140 consists essentially of gallium nitride (GaN), and contains silicon (Si) as a donor at a concentration higher than that in the first N-type semiconductor layer 120. In the present embodiment, the average concentration of silicon (Si) over the entire region of the second N-type semiconductor layer 140 is equal to or lower than $1.0 \times 10^{19}$ $cm^{-3}$. The second N-type semiconductor layer 140 is also referred as to 'n⁺-GaN'.

The second N-type semiconductor layer 140 has an interface 141 and an interface 142. The interface 141 of the second N-type semiconductor layer 140 is a surface parallel to the Y-axis and the Z-axis and orienting to the −X-axis direction. The interface 141 is adjacent to the P-type semiconductor layer 130. The interface 142 of the second N-type semiconductor layer 140 is a surface parallel to the Y-axis and the Z-axis and orienting to the +X-axis direction, and is opposed to the interface 141. The interface 142 is adjacent to an electrode 240.

A thickness of the second N-type semiconductor layer 140 is a distance between the interface 141 and the interface 142 in the X-axis direction, and in the present embodiment, is 0.2 μm. In other embodiments, the thickness of the second N-type semiconductor layer 140 may be any value selected from a range of 0.1 to 0.5 μm.

(2)-5 Electrodes and Insulation Layers

Electrodes are formed on the substrate and each layer. Namely, the electrode 230, also referred to as a P body electrode, is formed on the interface 132 of the P-type semiconductor layer 130. The electrode 230 reduces electrons and positive holes generated in the P-type semiconductor layer 130, thereby enhancing withstanding voltage. The electrode 240, also referred to as a source electrode, is formed on the interface 142 of the second N-type semiconductor layer 140. An insulation layer 260 is formed to extend from an upper surface of the first N-type semiconductor layer 120 to a side surface (the right side in the figure) of the P-type semiconductor layer 130, and an insulation layer 270 is formed to extend from the upper surface of the first N-type semiconductor layer 120 to a side surface (the left side in the figure) of the second N-type semiconductor layer 140 by way of a side surface of the P-type semiconductor layer 130. The insulation layers 260 and 270 are layers formed of aluminum oxide ($Al_2O_3$), silicon dioxide ($SiO_2$), or the like. On the insulation layer 270, an electrode 250, also referred to as a gate electrode, is formed.

(3) Method of Manufacturing the Semiconductor Apparatus 10

Figure 2:
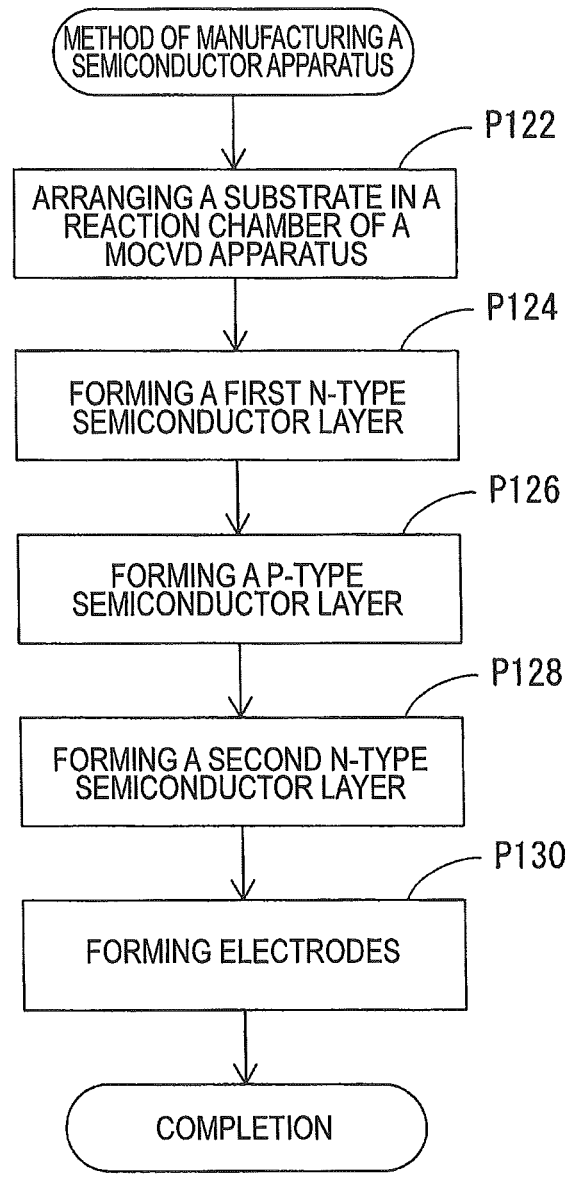
FIG. 2 is a flow chart showing a method of manufacturing the semiconductor apparatus.

FIG. 2 is a flow chart showing the method of manufacturing the semiconductor apparatus 10. Upon manufacturing of the semiconductor apparatus 10, a manufacturer firstly prepare a MOCVD apparatus for implementing the metal organic chemical vapor deposition (MOCVD) method and then arrange a plurality of substrates 110 in a reaction chamber of the MOCVD apparatus (step P122). Preferably, substrates having a diameter of more than 2 inches are used as the substrates 110. In this step, the substrates 110 having a diameter of 2 inches or less may be arranged in a closely-packed state using a plurality of substrates thereof (e.g., seven substrates). The substrates 110 have a thickness of 300 μm to 500 μm and are doped with silicon (Si). The concentration thereof is $1.0 \times 10^{18}$ $cm^{-3}$.

In a subsequent step P124, the MOCVD apparatus forms the first N-type semiconductor layer 120 on the substrate 110 by crystal growth using silane as a dopant source, based on operations of the manufacturer. Trimethylgallium (TMGa) as a group III raw material, ammonia ($NH_3$) as a group V raw material, and silane as an N-type dopant source are supplied to the reaction chamber through a piping of the MOCVD apparatus, using hydrogen ($H_2$) as a carrier gas. In this case, the first N-type semiconductor 120 is formed to have, for example, a thickness of 5 to 15 μm. Meanwhile, V/III of the sources, a growth pressure, a concentration of silicon (Si) and the like will be described below.

Then, in a step P126, the MOCVD apparatus forms the P-type semiconductor layer 130 on the first N-type semiconductor layer 120 by crystal growth using CP2Mg (bis(cyclopentadienyl)magnesium) as a dopant source, based on operations of the manufacturer.

In a subsequent step P128, the MOCVD apparatus forms the second N-type semiconductor layer 140 on the P-type semiconductor layer 130 by crystal growth using silane as a dopant source, based on operations of the manufacturer. The concentration of silicon (Si) in the second N-type semiconductor layer 140 is higher than that in the first N-type semiconductor layer 120. As conditions of the step P128, the same conditions as those in the step P124 with respect to sources, pressure and the like, except for the concentration of silicon (Si), can be employed.

Next, in a step P130, the manufacturer takes an intermediate product of the semiconductor apparatus 10 out of the MOCVD apparatus, and forms the electrodes 210, 230, 240 and 250 and the insulation layers 260 and 270, respectively, on the intermediate product. Thereby, the semiconductor apparatus 10 is completed.

(4) Operations/Effects of the Embodiment (4)-1 A concentration of carbon (C) and a concentration of donor in the step (P124) of forming the first N-type semiconductor layer 120 will be described.

Figure 3:
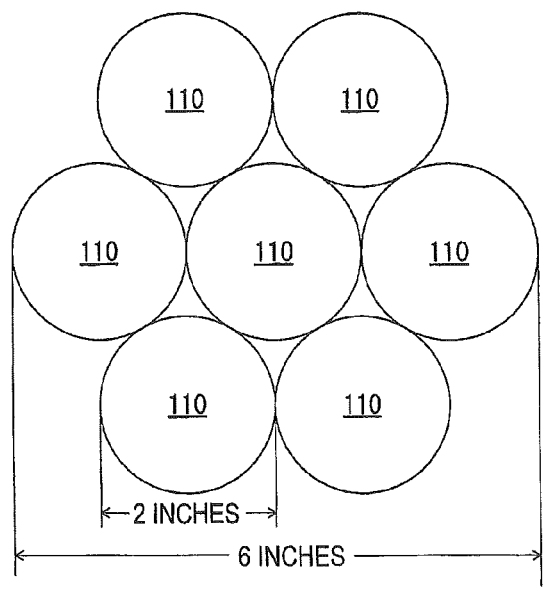
FIG. 3 is an explanatory view explaining a state where a plurality of substrates are arranged in a reaction chamber.

FIG. 3 is an explanatory view explaining a state where a plurality of substrates 110 are arranged in the reaction chamber. In FIG. 3, ones having a diameter of 2 inches were used as the substrates 110, and seven substrates 110 were arrange within an area of 6 inches to be arranged in a closely packed state. Namely, six substrates are arranged to surround one substrate 110. This is intended to equate placing seven GaN substrates of 2 inches with using a substrate of 6 inches in a pseudo manner, instead of using substrates of 2 inches or greater (e.g., 6 inches). Then, the first N-type semiconductor layer 120 was grown and stacked on the plurality of substrates 110 and subsequently, the concentrations of carbon (C) and donor on a face of the first N-type semiconductor layer 120 was investigated.

Figure 4:
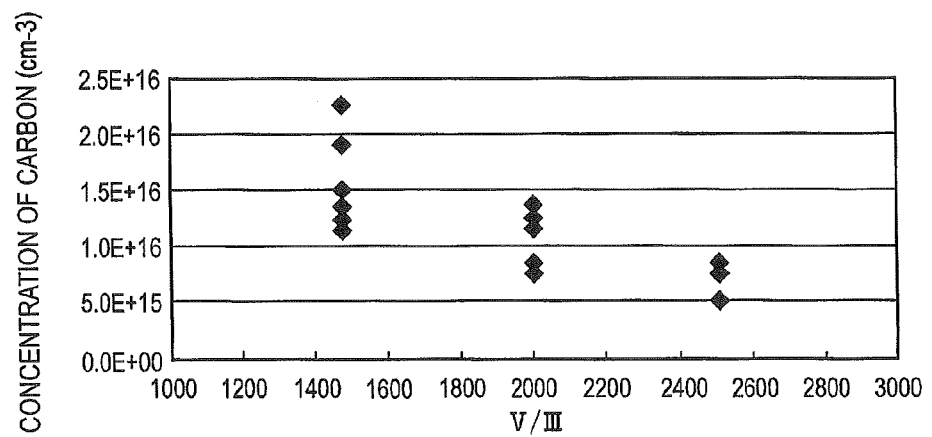
FIG. 4 is a graph explaining a relationship of a concentration of carbon (C) on a face of a first N-type semiconductor layer and a V/III.
Figure 5:
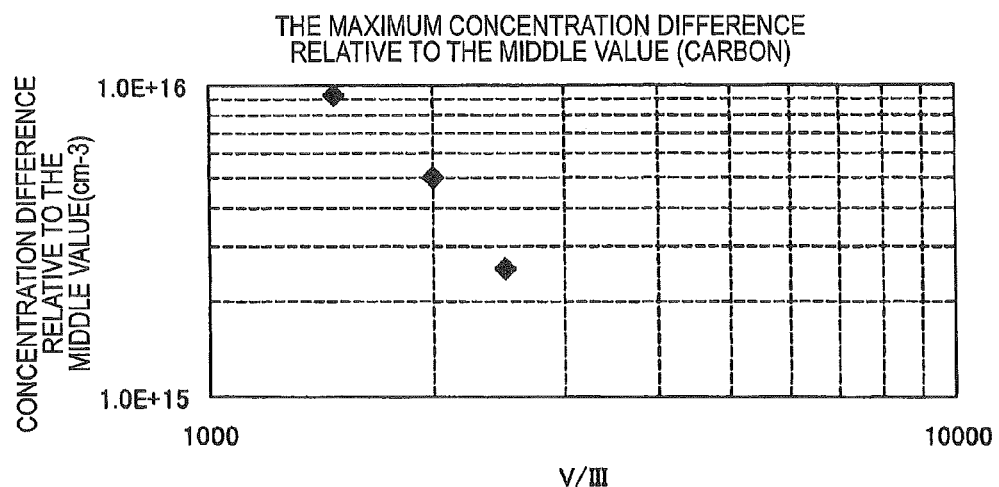
FIG. 5 is an explanatory view explaining a relationship of a concentration difference between a median and the other measured values in the concentration of carbon (C) and the V/III.

FIG. 4 is a graph explaining a relationship of the concentration of carbon (C) on the face of the first N-type semiconductor layer 120 and the V/III, in which variation in the concentration of carbon (C) of the first N-type semiconductor layer 120 grown on the substrates 110 while varying the V/III is illustrated. The V/III means a mole ratio of the group V raw material to the group III raw material. Specifically, to obtain the graph in FIG. 4, the present inventors used trimethylgallium (TMGa) as the group III raw material and also used ammonia ($NH_3$) as the group V raw material. Three kinds of V/III, i.e., 1473 (first group), 2000 (second group), and 2506 (third group), were used. Then, a plurality of samples (seven substrates), in which an N-type semiconductor layer was formed on each of substrates of 2 inches, were manufactured and the concentrations of carbon (C) thereof were measured. The concentrations of carbon (C) were measured using a secondary ion-microprobe mass spectrometer (SIMS). In this case, each of the measured values was obtained by sampling the concentration of carbon (C) on the face of each of the seven substrates. FIG. 5 is an explanatory view explaining a relationship of concentration differences between a median and other measured values in the concentrations of carbon (C) and the V/III. As shown in FIG. 5, the concentrations of carbon (C) were studied using differences between the median and the other values in the measured values.

As shown in FIGS. 4 and 5, the median of the concentration of carbon (C) in the first group (V/III: 1473) is $1.4 \times 10^{16}$ cm$^{-3}$, and the maximum value in difference between the median and the other measured values is $9.3 \times 10^{15}$ cm$^{-3}$. The median of the concentration of carbon (C) in the second group (V/III: 2000) is $8.7 \times 10^{15}$ cm$^{-3}$, and the maximum value in difference between the median and the other measured values is $5.0 \times 10^{15}$ cm$^{-3}$. The median of the concentration of carbon (C) in the third group (V/III: 2506) is $7.4 \times 10^{15}$ cm$^{-3}$, and the maximum value in difference between the median and the other measured values is $2.6 \times 10^{15}$ cm$^{-3}$. If comparing the first to third groups, it can be found that, as the V/III is increased, the median of the concentration of carbon (C) is decreased from $1.4 \times 10^{16}$ cm$^{-3}$ to $7.4 \times 10^{15}$ cm$^{-3}$ and also the maximum value in difference between the median and the other measured values is narrowed from $9.3 \times 10^{15}$ cm$^{-3}$ to $2.6 \times 10^{15}$ cm$^{-3}$, and thereby variation in concentration is reduced.

Figure 6:
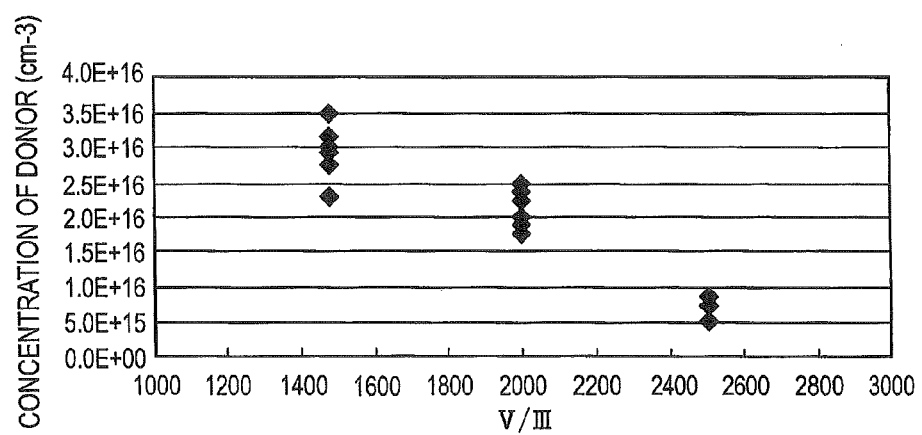
FIG. 6 is a graph explaining a relationship of a concentration of donor on the face of the first N-type semiconductor layer and the V/III.
Figure 7:
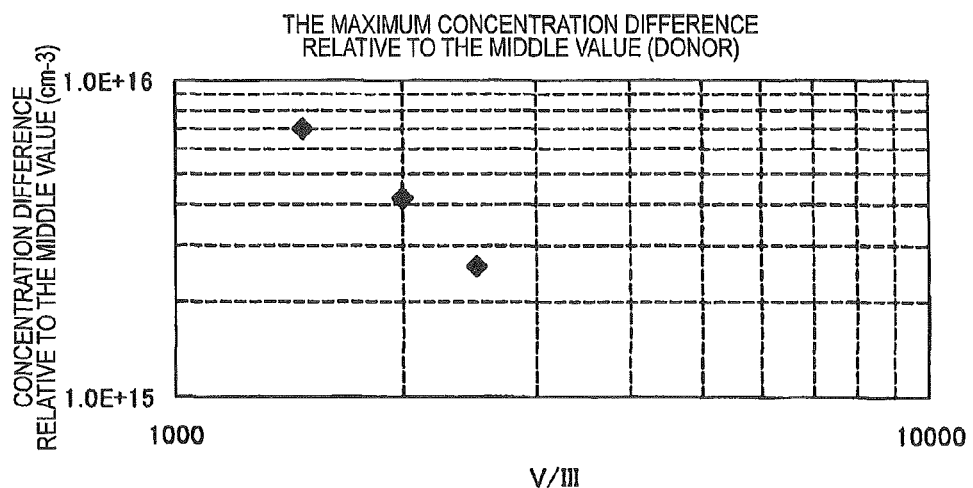
FIG. 7 is an explanatory view explaining a relationship of a concentration difference between a median and the other measured values in the concentration of donor and the V/III.

FIG. 6 is a graph explaining a relationship of a concentration of a donor on the face of the first N-type semiconductor layer 120 and the V/III. Correspondingly to FIG. 4, the concentrations of donor with respect to the V/III (the first to third groups) were measured on the seven substrates. The concentrations of donor were obtained by a C-V measurement. In this case, the measured values were obtained by sampling the concentration of donor on the face of each of the seven substrates, similarly to the concentration of carbon (C) in FIG. 4. FIG. 7 is an explanatory view explaining a relationship of concentration differences between a median and other measured values in the concentrations of donor and the V/III. As shown in FIG. 7, the concentrations of donor were studied using differences between the median and the other values in the measured values.

As shown in FIGS. 6 and 7, the median of the concentration of donor in the first group (V/III: 1473) is $3.0 \times 10^{16}$ cm$^{-3}$, and the maximum value in difference between the median and the other measured values is $7.0 \times 10^{15}$ cm$^3$. The median of the concentration of donor in the second group (V/III: 2000) is $2.0 \times 10^{16}$ cm$^{-3}$, and the maximum value in difference between the median and the other measured values is $4.2 \times 10^{15}$ cm$^{-3}$. The median of the concentration of donor in the third group (V/III: 2506) is $7.3 \times 10^{15}$ cm$^{-3}$, and the maximum value in difference between the median and the other measured values is $2.6 \times 10^{15}$ cm$^{-3}$. If comparing the first to third groups, as the V/III is increased, the median of the concentration of donor is decreased from $3.0 \times 10^{16}$ cm$^{-3}$ to $7.3 \times 10^{15}$ cm$^{-3}$ and also the maximum value in difference between the median and the other measured values is narrowed from $7.0 \times 10^{15}$ cm$^{-3}$ to $2.6 \times 10^{15}$ cm$^{-3}$. Thus, it can be found that the concentrations of donor exhibit the same tendency as those in the concentrations of carbon (C). Namely, it can be found that the concentrations of silicon (Si) exhibit the same tendency as those in the concentrations of carbon (C). From this, it is conceived that the donor and the carbon have a relationship as described below.

Carbon (C) of the first N-type semiconductor layer 120 compensates the donor of the first N-type semiconductor layer 120, thereby reducing action of the donor. Accordingly, variation in concentration of the donor can be reduced by lowering the concentration of carbon (C) and also decreasing variation in concentration of carbon (C). By reducing variation in concentration of the donor, it is possible that, when a plurality of chips are cut out from the substrate 110 of more than 2 inches to form semiconductor apparatuses, the action of the donor in each of the obtained semiconductor apparatuses is stable and uniform.

The lower the variation in concentration of the donor, the more preferable it is, but for example, when a specification, in which, as a range in which products are less affected, the value of the concentration of donor is equal to or less than $1.4 \times 10^{16}$ cm$^{-3}$ and variation thereof with respect to the median is more than $5.0 \times 10^{15}$ cm$^{-3}$, is required, the concentration of donor is regulated below such values due to a limitation in an adjusting range of the concentration of carbon (C) in the first N-type semiconductor layer 120.

The first N-type semiconductor layer 120 is formed by crystal growth using the group III raw material including trimethylgallium (TMGa) and the group V raw material including ammonia ($NH_3$). Accordingly, carbon (C) in trimethylgallium (TMGa) is entrained into the first N-type semiconductor layer 120. Therefore, when the V/III is increased, the concentration of carbon (C) in the N-type semiconductor layer can be decreased, but if the V/III is higher than 4000, the crystal growth rate is reduced, thereby decreasing productivity. On the other hand, if the V/III is lower than 2100, the concentration of carbon (C) is increased, thereby increasing variation in the concentration of donor. Therefore, the V/III of the group V raw material to the group III raw material adjusted to a range of 2100 to 4000 is preferably used.

Also, the range of the V/III is more preferably from 2500 to 3500, further more preferably, from 2500 to 3000. By using such V/III, the concentration of carbon (C) can be reduced, thereby decreasing variation in the concentration of donor.

(4)-2 The reason that the concentration of carbon (C) in the step (P126) of forming the P-type semiconductor layer 130 is set to be equal to or higher than $5.0 \times 10^{16}$ cm$^{-3}$ is described.

If the concentrations of carbon in the first and second N-type semiconductor layers 120 and 140 are equal to or lower than $1.0 \times 10^{16}$ cm$^{-3}$, the P-type semiconductor 130 becomes a rate-limiting factor in an electron mobility of the semiconductor apparatus 10. Therefore, to improve an ON resistance and the like of the semiconductor apparatus, it is requested that a channel mobility between the P-type semiconductor layer 130 and the insulation layer 270, i.e., a sheet conductivity σ[S] is higher, for example, that the sheet conductivity σ[S] of the channel is 40 μS or higher. Herein, the sheet conductivity a is expressed by the following equation (1).

$$\sigma = \mu \cdot \epsilon \cdot Em/2 \quad (1)$$

μ: channel mobility [cm$^2$/Vs]
ε: dielective constant of the insulation layer [F/cm]
Em: breakdown voltage [V/cm]

Because ε and Em are determined by material properties, for example, if substituting $\epsilon = 3 \times 10^{-13}$ and $Em = 5 \times 10^6$, the channel mobility μ has to be equal to or higher than 50 cm$^2$/Vs.

Figure 8:
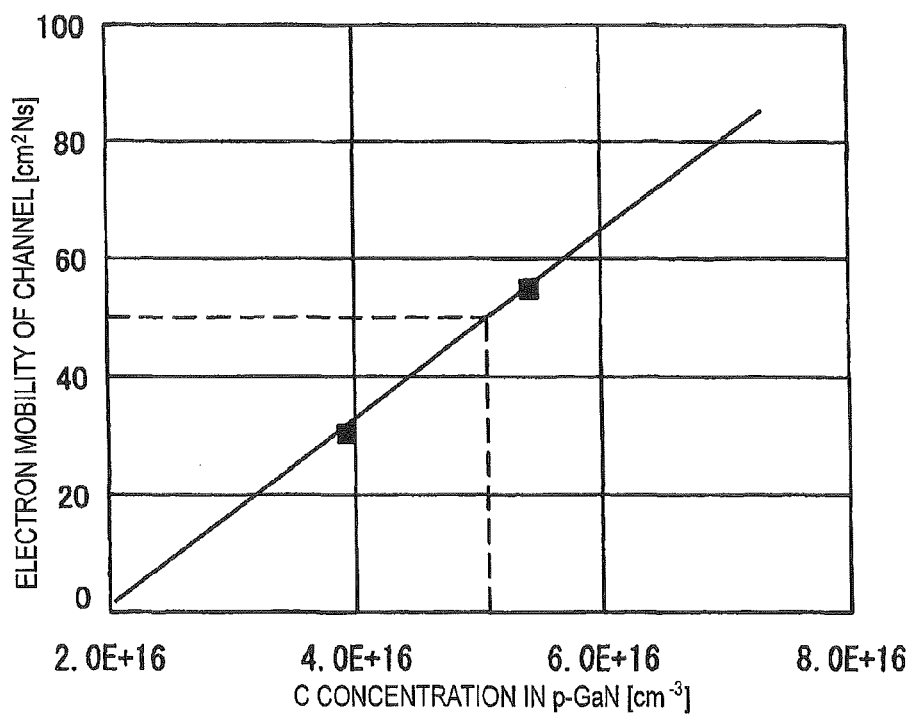
FIG. 8 is a graph explaining a relationship of a channel mobility μ and a concentration of carbon (C) of a P-type semiconductor layer.

FIG. 8 is a graph explaining a relationship of the channel mobility μ and the concentration of carbon (C). A vertical axis represents the channel mobility μ and a horizontal axis represents the concentration of carbon (C) of the P-type semiconductor layer. In FIG. 8, it can be found that, as the concentration of carbon (C) in the P-type semiconductor layer 130 is increased, the electron mobility of the channel is increased. Here, it can be found that, when the channel mobility μ is set to be equal to or higher than 50 cm$^2$/Vs, the concentration of carbon (C) in the P-type semiconductor layer 130 set to be equal to or higher than $5.0 \times 10^{16}$ cm$^{-3}$ is preferable.

Figure 9:
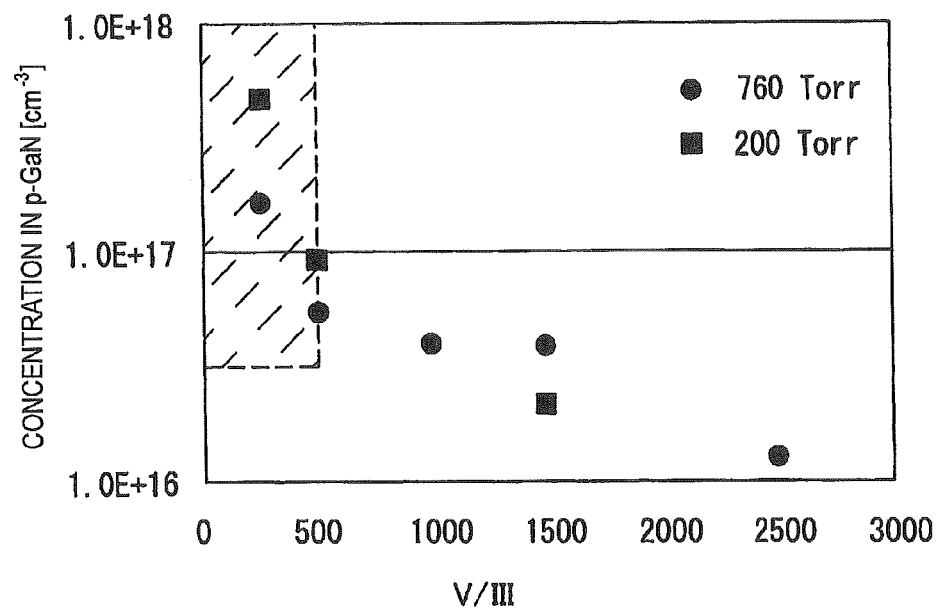
FIG. 9 is a graph explaining a relationship of a concentration of carbon (C) and the V/III.

FIG. 9 is a graph explaining a relationship of the concentration of carbon (C) and the V/III. To set the concentration of carbon (C) to be equal to or higher than t than $5.0 \times 10^{16}$ cm$^{-3}$, the following method can be employed in the step P126 of FIG. 2. Specifically, to obtain the graph in FIG. 9, the inventors used trimethylgallium (TMGa) as the group III raw material and also used ammonia (NH$_3$) as the group V raw material, and also used as a doping source magnesium (Mg) of $1.0 \times 10^{18}$ cm$^{-3}$ to $1.0 \times 10^{20}$ cm$^{-3}$. Cases where the V/III was varied between 250 and 2500 and the pressure is set to 760 Torr and 200 Torr are investigated. A plurality of samples, in each of which a P-type semiconductor layer was formed, were manufactured and the concentrations of carbon (C) thereof were measured. The concentrations of carbon (C) were measured using a secondary ion-microprobe mass spectrometer (SIMS).

From FIG. 9, it was found that the concentration of carbon (C) of the P-typed semiconductor layer 130 is increased as the V/III is deceased. To set the concentration of carbon (C) to be equal to or higher than $5.0 \times 10^{16}$ cm$^{-3}$, the V/III has to be within a range represented by oblique lines in FIG. 9, i.e., 500 or lower. In addition, the V/III has to be 1 or higher to achieve a vapor deposition.

Also, although the pressure supplying the source gases was investigated with respect to cases of 200 to 760 Torr, carbon (C) can be increased in a case of 200 Torr. Herein, the pressure is preferably a range of 300 to 500 Torr, particularly preferably, 400 to 450 Torr.

Such concentration of carbon (C) can be easily set by adjusting the V/III and pressures of supplying the sources gases.

The concentration of carbon (C) of the P-type semiconductor layer 130 is preferably equal to or more than $5.0 \times 10^{16}$ cm$^{-3}$, but if considering influences of electric properties, such as withstanding voltage, of the semiconductor apparatus 10, preferably $1 \times 10^{18}$ cm$^{-3}$ or lower. In addition, the concentration of carbon (C) of the P-type semiconductor layer 130 is preferably five or more times larger than the concentrations of carbon (C) of the first and second N-type semiconductor layers 120 and 140, thereby enhancing the electron mobility. Particularly preferably, the concentration of carbon (C) of the P-type semiconductor layer 130 is seven or more times.

B. Other Embodiments

The present invention is not limited to the foregoing embodiments, examples or variants thereof, but can be embodied in various configurations without departing from the scope and sprits of the invention. For example, technical features in the embodiments, examples, and variants thereof corresponding to technical features in each of the forms described in the section "Summary of the Invention" can be appropriately modified and combined to solve some or all of the technical problems as described above, or to achieve some or all of the effects as described above. In addition, the technical features can be appropriately omitted, unless it is mentioned herein that the technical features are essential.

Figure 10:
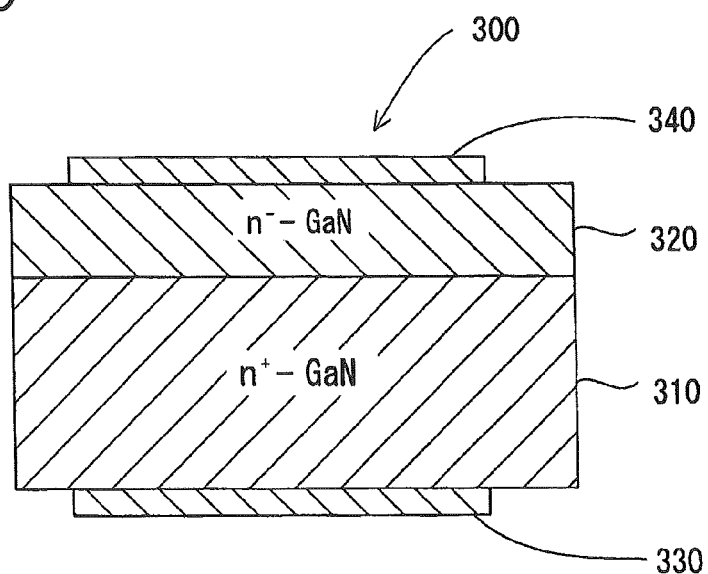
FIG. 10 is a sectional view showing a semiconductor apparatus according to another embodiment.

FIG. 10 is a sectional view showing a semiconductor apparatus according to another embodiment. The present embodiment is an example applied to a Schottky barrier diode. A semiconductor apparatus 300 is constituted by arranging an N-type semiconductor layer 320 of a GaN substrate 310, connecting an ohmic electrode 330 to an outer surface of the substrate 310, and then connecting a Schottky electrode 340 to an outer surface of the N-type semiconductor layer 320. As such, various configurations, in which an N-type semiconductor layer is formed on a substrate, can be employed as a semiconductor apparatus, to which the present invention can be applied.

In addition to the semiconductor wafer on which a concentration of carbon (C) or donor in semiconductor layers is adjusted, the semiconductor apparatus according to the present invention includes various components, such as electrodes, as the peripheral components of the semiconductor wafer. For example, the present invention can be embodied in aspects, such as an electric device having a semiconductor apparatus of the foregoing type or an apparatus for manufacturing a semiconductor apparatus of the foregoing type.

What is claimed is:

1. A semiconductor apparatus comprising:
   a semiconductor substrate that has a diameter of 2 inches or larger;
   an N-type semiconductor layer that is stacked on the semiconductor substrate using a material including gallium nitride (GaN); and
   a P-type semiconductor layer formed on the N-type semiconductor layer;

wherein a median of a plurality of measured values of concentration of carbon (C) at a plurality of locations on a face of a region of the N-type semiconductor layer is equal to or lower than $1.0\times10^{16}$ cm$^{-3}$, and a maximum value in difference between the median and the other measured values is lower than $5\times10^{15}$ cm$^{-3}$, wherein the N-type semiconductor layer includes silicon as a donor, a median of a plurality of measured values of concentration of the silicon at a plurality of locations on the face of the region of the N-type semiconductor layer is equal to or less than $1.4\times10^{16}$ cm$^{-3}$, and a maximum value in difference between the median of the plurality of measured values of concentration of the silicon and the other measured values of concentration of the silicon is less than $5\times10^{15}$ cm$^{-3}$, and wherein a concentration of carbon in the P-type semiconductor layer is greater than a concentration of carbon in the N-type semiconductor layer.

2. The semiconductor apparatus according to claim 1, wherein electrodes are respectively connected to the substrate and the N-type semiconductor layer.

3. The semiconductor apparatus according to claim 1, further comprising:
an additional N-type semiconductor layer that is stacked on the P-type semiconductor layer;
wherein a drain electrode is connected to the substrate, a source electrode is connected the additional N-type semiconductor layer, and
a gate electrode is connected to an insulation layer on the P-type semiconductor layer.

4. The semiconductor apparatus according to claim 1, wherein the semiconductor substrate comprises n$^{30}$ GaN including a concentration of silicon which is equal to or greater than $1.0\times10^{18}$ cm$^{-3}$.

5. The semiconductor apparatus according to claim 1, wherein a thickness of the semiconductor substrate is in a range from 100 μm to 1 mm.

6. The semiconductor apparatus according to claim 1, wherein a thickness of the N-type semiconductor layer is in a range from 5 μm to 15 μm.

7. The semiconductor apparatus according to claim 1, further comprising:
a first electrode comprising at least one of platinum, Co, palladium, nickel and gold, and formed on a first side of the semiconductor substrate, the N-type semiconductor layer being formed on a second side of the semiconductor substrate which is opposite the first side.

8. The semiconductor apparatus according to claim 7, further comprising:
an other N-type semiconductor layer formed on the P-type semiconductor layer, a concentration of silicon in the N-type semiconductor layer being less than a concentration of silicon in the other N-type semiconductor layer.

9. The semiconductor apparatus according to claim 8, wherein a concentration of carbon in the P-type semiconductor layer is equal to or greater than $5.0\times10^{16}$ cm$^{-3}$ and equal to or less than $1\times10^{18}$ cm$^{-3}$, and is at least five times the concentration of carbon of the N-type semiconductor layer and the other N-type semiconductor layer.

10. The semiconductor apparatus according to claim 8, wherein the P-type semiconductor layer comprises p-GaN including magnesium as an acceptor.

11. The semiconductor apparatus according to claim 10, wherein a concentration of the magnesium in the P-type semiconductor layer is equal to or greater than $1.0\times10^{18}$ cm$^{-3}$ and equal to or less than $1.0\times10^{20}$ cm$^{-3}$.

12. The semiconductor apparatus according to claim 8, wherein a thickness of the P-type semiconductor layer is in a range from 0.3 μm to 2 μm.

13. The semiconductor apparatus according to claim 8, wherein the other N-type semiconductor layer comprises n$^+$GaN including a concentration of silicon which is equal to or less than $1.0\times10^{19}$ cm$^{-3}$.

14. The semiconductor apparatus according to claim 8, wherein a thickness of the other N-type semiconductor layer is in a range from 0.1 μm to 0.5 μm.

15. The semiconductor apparatus according to claim 8, further comprising:
a second electrode formed on the other N-type semiconductor layer;
a first insulation layer formed on an upper surface of the N-type semiconductor layer and a first side surface of the P-type semiconductor layer; and
a second insulation layer formed on the upper surface of the N-type semiconductor layer, a second side surface of the P-type semiconductor layer, and a side surface of the other N-type semiconductor layer.

16. A semiconductor apparatus comprising:
a semiconductor substrate including a diameter of at least 2 inches, the substrate comprising n$^+$GaN including a concentration of silicon which is equal to or greater than $1.0\times10^{18}$ cm$^{-3}$,
a first N-type semiconductor layer formed on the semiconductor substrate and comprising n$^-$GaN including silicon as a donor, a median of a plurality of measured values of concentration of the silicon at a plurality of locations on a face of a region of the first N-type semiconductor layer being equal to or less than $1.4\times10^{16}$ cm$^{-3}$, and a maximum value in difference between the median and the other measured values being less than $5\times10^{15}$ cm$^{-3}$;
a P-type semiconductor layer formed on the first N-type semiconductor layer and comprising p-GaN including magnesium as an acceptor, a concentration of the magnesium in the P-type semiconductor layer being equal to or greater than $1.0\times10^{18}$ cm$^{-3}$ and equal to or less than $1.0\times10^{20}$ cm$^{-3}$; and
a second N-type semiconductor layer formed on the P-type semiconductor layer and comprising n$^+$GaN including a concentration of silicon which is equal to or less than $1.0\times10^{19}$ cm$^{-3}$, the concentration of silicon in the second N-type semiconductor layer being greater than a concentration of silicon in the first N-type semiconductor layer,
wherein a median of a plurality of measured values of concentration of carbon at a plurality of locations on the face of the region of the first N-type semiconductor layer is equal to or less than $1.0\times10^{16}$ cm$^{-3}$, and a maximum value in difference between the median of the plurality of measured values of concentration of carbon and the other measured values of the plurality of measured values of concentration of carbon being less than $5\times10^{15}$ cm$^{-3}$, and
wherein a concentration of carbon in the P-type semiconductor layer is greater than a concentration of carbon in the first N-type semiconductor layer.

* * * * *